United States Patent
Li (10) Patent No.: US 7,882,607 B2
(45) Date of Patent: Feb. 8, 2011

(54) METHOD OF MANUFACTURING AN ACTUATOR DEVICE

(75) Inventor: Xin-Shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 608 days.

(21) Appl. No.: 11/869,261

(22) Filed: Oct. 9, 2007

(65) Prior Publication Data

US 2008/0088207 A1    Apr. 17, 2008

(30) Foreign Application Priority Data

Oct. 11, 2006    (JP) .............................. 2006-278009

(51) Int. Cl.
*H01L 41/053* (2006.01)
*H02N 2/04* (2006.01)

(52) U.S. Cl. ..................... 29/25.35; 29/890.1; 310/324; 347/70

(58) Field of Classification Search ................ 29/25.35, 29/890.1; 310/321, 324; 347/68, 70; 501/10
See application file for complete search history.

(56) References Cited

U.S. PATENT DOCUMENTS

| 5,486,495 A | * | 1/1996 | Jewell et al. .................. 501/10 |
| 6,256,849 B1 | * | 7/2001 | Kim, II ....................... 29/25.35 |
| 7,411,339 B2 | | 8/2008 | Xin-Shin et al. |
| 2006/0132549 A1 | | 6/2006 | Ito |
| 2008/0034563 A1 | | 2/2008 | Xin-Shin et al. |

FOREIGN PATENT DOCUMENTS

| JP | 63136677 A | * | 6/1988 | ................ 29/25.35 |
| JP | 11-204849 A | | 7/1999 | |
| JP | 2003-110158 A | | 4/2003 | |
| JP | 2005-166719 A | | 6/2005 | |
| JP | 2005-176433 | | 6/2005 | |
| JP | 2005-228983 A | | 8/2005 | |
| JP | 2005-295786 A | | 10/2005 | |

\* cited by examiner

*Primary Examiner*—A. Dexter Tugbang
(74) *Attorney, Agent, or Firm*—Sughrue Mion, PLLC (57) ABSTRACT

A method of manufacturing an actuator device includes forming a Zr layer on one surface of a substrate, forming a $ZrO_2$ layer by oxidizing the Zr layer, forming a lower electrode on top of the $ZrO_2$ layer, forming a piezoelectric layer on top of the lower electrode, and forming an upper electrode on top of the piezoelectric layer. In the method, in forming the Zr layer, the Zr layer is formed through crystal growth of Zr, and the Zr layer thus formed has special crystal regions that protrude from the opposite surface of the Zr layer from the substrate. Each special crystal region has a height of 10 to 100 nm and a diameter of 0.1 to 1 μm when viewed from above, and the special crystal regions exist with a density of $1.0 \times 10^6$ to $1.0 \times 10^3 / cm^2$.

5 Claims, 9 Drawing Sheets

SIZE VIEWED FROM ABOVE

402

HEIGHT

METHOD OF MANUFACTURING AN ACTUATOR DEVICE

The entire disclosure of Japanese Patent Application No. 2006-278009 filed Oct. 11, 2006 is expressly incorporated by reference herein.

BACKGROUND

1. Technical Field

The present invention relates to an actuator device that includes a piezoelectric element formed of a lower electrode film, a piezoelectric layer made of a piezoelectric material, and an upper electrode film, all of which are formed on a vibration plate. The invention also relates to a liquid-jet head using the actuator device, and to a method of manufacturing the actuator device.

2. Related Art

An actuator device mounted, for example, on a liquid-jet head that ejects liquid droplets, has a piezoelectric element, which produces a displacement when a voltage is applied. A well-known example of such a liquid-jet head is a type of ink-jet recording head. The type of ink-jet recording head ejects ink droplets from a nozzle orifice communicated with a pressure generating chamber, a part of which is formed by a vibration plate. A deformation of this vibration plate caused by the piezoelectric element pressurizes the ink in the pressure generating chamber, and thus the ink droplets are ejected. The type of ink-jet recording head has two types that have been already put into practical use. One is equipped with a longitudinal-vibration-mode piezoelectric actuator device that extends and contracts in the axial direction of the piezoelectric element. The other is equipped with a flexure-vibration-mode piezoelectric actuator device.

In the former, that is, the ink-jet recording head equipped with a longitudinal-vibration-mode piezoelectric actuator device, the volume of the pressure generating chamber can be changed by a contact of just an end face of the piezoelectric element with the vibration plate. As a consequence, a head suitable for a high-density printing can be manufactured. This one, however, has some problems. The piezoelectric element has to be cut into a comb shape in accordance with the pitch at which the nozzle orifices are arranged, but this is a difficult process. The cut pieces of piezoelectric element have to be positioned at, and fixed to, the pressure generation chambers. This operation makes the manufacturing process complicated. In contrast, in the latter, that is, the ink-jet recording head equipped with flexure-vibration-mode piezoelectric actuator device, the piezoelectric element can be made to be attached to the vibration plate in a relatively easy process. Specifically, the attaching can be done by applying, and then by baking, a green sheet of a piezoelectric material to the pressure generating chambers in accordance with the shape of the pressure generating chambers. This one, however, has its own problems. The use of flexure vibration requires a space of a certain degree of large area, and makes a high-density arrangement difficult. In this respect, an actuator device is developed to solve the inconvenience of the ink-jet recording head of the latter. In the actuator device, a uniform piezoelectric material layer is formed all over the entire surface of a vibration plate by a film forming technique, and then cut into pieces each with a shape corresponding to each pressure generating chamber by a lithography method. In this way, piezoelectric elements are formed independently for each pressure generating chamber.

Lead zirconate titanate (PZT) is an example of a material for the piezoelectric material layer constituting the piezoelectric element. In this case, when the piezoelectric material layer is baked, the lead component of the piezoelectric material layer is diffused into a silicon oxide ($SiO_2$) film which is formed on the surface of the passage-forming substrate made of silicon (Si), and which constitutes the vibration plate. The lead component thus diffused lowers the melting point of the silicon oxide, so that the silicon oxide film is melt by the heat generated when the piezoelectric material layer is baked. For the purpose of solving such a problem, some piezoelectric actuator devices are provided with a zirconium oxide ($ZrO_2$) layer formed on the silicon oxide film to form a part of the vibration plate, and the zirconium oxide layer thus formed blocks the diffusion of the lead component of the piezoelectric material layer into the silicon oxide film (see, for example, JP-A-11-204849, esp. FIG. 1, FIG. 2, and page 5).

The actuator device with the above-described structure has a problem. The adhesion between the zirconium oxide layer and a lower electrode layer formed on top of the zirconium oxide layer as well as between zirconium oxide layer and a silicon oxide film that lies under the zirconium oxide layer is not sufficiently strong. As a consequence, when the actuator device is driven to produce flexure vibration, a delamination may occur between the lower electrode and the zirconium oxide layer, and between the underlying film and the zirconium oxide layer. This kind of problem occurs not only in the actuator device mounted on a liquid-jet head, such as an ink-jet recording head, but also in actuator devices mounted on other apparatuses.

SUMMARY

Some advantages of some aspects of the invention include providing an actuator device that is excellent in adhesion between the zirconium oxide layer and the lower electrode, as well as between the zirconium oxide layer and the underlying layer. Also included are providing a liquid-jet head, and a method of manufacturing such an actuator device.

A first aspect of the invention provides a method of manufacturing an actuator device that includes forming a Zr layer on one surface of a substrate, forming a $ZrO_2$ layer by oxidizing the Zr layer, forming a lower electrode on top of the $ZrO_2$ layer, forming a piezoelectric layer on top of the lower electrode, and forming an upper electrode on top of the piezoelectric layer. In the manufacturing method, in forming the Zr layer, the Zr layer is formed through crystal growth of Zr, and the Zr layer thus formed has special crystal regions that protrude from the opposite surface of the Zr layer from the substrate. Each special crystal region has a height of 10 to 100 nm and a diameter of 0.1 to 1 μm when viewed from above, and the special crystal regions exist with a density of $1.0 \times 10^6$ to $1.0 \times 10^8 / cm^2$.

According to the first aspect, the $ZrO_2$ layer is formed by oxidizing the Zr layer that is formed so as to have predetermined special crystal regions on the lower-electrode side surface thereof. As a result, the actuator device thus manufactured has excellent adhesion between the $ZrO_2$ layer and the underlying base of the $ZrO_2$ layer, such as the substrate, and excellent adhesion between the $ZrO_2$ layer and the lower electrode.

A second aspect of the invention provides the method of manufacturing an actuator device according to the first aspect, in which method, in forming the Zr layer, the Zr layer is formed through crystal growth of Zr, and the Zr layer thus formed has special crystal regions that protrude from the opposite surface of the Zr layer from the substrate. Each special crystal region has a height of 16.0 to 40.6 nm and a diameter of 0.3 to 0.5 μm when viewed from above, and the special crystal regions exist with a density of $1.11\times10^7$ to $1.25\times10^7/cm^2$.

According to the second aspect, the $ZrO_2$ layer is formed by oxidizing the Zr layer that is formed so as to have predetermined special crystal regions. As a result, the actuator device thus manufactured has superior adhesion between the $ZrO_2$ layer and the underlying base, such as the substrate, and with superior adhesion between the $ZrO_2$ layer and the lower electrode.

A third aspect of the invention provides the method of manufacturing an actuator device according to the first or second aspect, in which method, in forming the Zr layer, a $SiO_2$ layer is formed on top of the substrate, and then the Zr layer is formed on top of the $SiO_2$ layer.

According to the third aspect, the actuator device thus formed has excellent adhesion between the $ZrO_2$ layer and the underlying base of the $ZrO_2$ layer, that is, the $SiO_2$ layer, as well as excellent adhesion between the $ZrO_2$ layer and the lower electrode.

A fourth aspect of the invention provides the method of manufacturing an actuator device according to any one of the first to third aspects, in which method, the substrate has the one surface made of a metal oxide, and in forming the Zr layer, the Zr layer is formed directly on top of the substrate.

According to the fourth aspect, the actuator device thus formed has excellent adhesion between the $ZrO_2$ layer and the underlying base of the $ZrO_2$ layer, that is, the substrate, as well as excellent adhesion between the $ZrO_2$ layer and the lower electrode.

A fifth aspect of the invention provides the method of manufacturing an actuator device according to any one of the first to forth aspects, in which method, in forming the Zr layer, the Zr layer is formed by a sputtering method.

According to the fifth aspect, the $ZrO_2$ layer is formed by oxidizing the Zr layer that is formed, by a sputtering method, so as to have predetermined special crystal regions. As a result, the actuator device thus manufactured has excellent adhesion between the $ZrO_2$ layer and the underlying base of the $ZrO_2$ layer as well as between the $ZrO_2$ layer and the lower electrode.

A sixth aspect of the invention provides an actuator device formed by the manufacturing method according to any one of the first to fifth aspects.

According to the sixth aspect, the actuator device thus manufactured has a $ZrO_2$ layer formed by oxidizing the Zr layer that is formed so as to have predetermined special crystal regions on the lower-electrode side surface. As a result, such an actuator device has excellent adhesion between the $ZrO_2$ layer and the underlying base of the $ZrO_2$ layer, such as the substrate, as well as between the $ZrO_2$ layer and the lower electrode. Consequently, the driving of the actuator device does not cause the delamination between the $ZrO_2$ layer and the underlying base of the $ZrO_2$ layer, such as the substrate, as well as between the $ZrO_2$ layer and the lower electrode.

A seventh aspect of the invention provides the actuator device according to the sixth aspect, in which device, the $ZrO_2$ layer includes protruding portions formed, on a lower-electrode side surface thereof, by oxidizing the special crystal regions. Each protruding portion has a height of 10 to 100 nm and a diameter of 0.1 to 1 μm when viewed from above, and the protruding portions exist with a density of $1.0\times10^6$ to $1.0\times10^8/cm^2$.

According to the seventh aspect, the actuator device thus manufactured has the $ZrO_2$ layer with the protruding portions that reflect the special crystal regions of the Zr layer, which is a precursor of the $ZrO_2$ layer. In addition, the actuator device has excellent adhesion between the $ZrO_2$ layer and the underlying base of the $ZrO_2$ layer, such as the substrate, as well as between the $ZrO_2$ layer and the lower electrode.

An eighth aspect of the invention provides the actuator device according to the seventh aspect, in which device, each protruding portion has a height of 16.0 to 40.6 nm and a diameter of 0.3 to 0.5 μm when viewed from above, and the protruding portions exist with a density of $1.11\times10^7$ to $1.25\times10^7/cm^2$.

According to the eighth aspect, the actuator device thus manufactured has the $ZrO_2$ layer with the protruding portions that reflect the special crystal regions of the Zr layer, which is a precursor of the $ZrO_2$ layer. In addition, the actuator device has superior adhesion between the $ZrO_2$ layer and the underlying base of the $ZrO_2$ layer, as well as between the $ZrO_2$ layer and the lower electrode.

A ninth aspect of the invention provides the actuator device according to the seventh or eighth aspect, in which device, the lower electrode includes convex portions being made to protrude from a piezoelectric-layer side surface thereof by the protruding portions of the $ZrO_2$ layer. In addition, each convex portion has a height of 10 to 100 nm and a diameter of 0.1 to 1 μm when viewed from above, and the protruding portions exist on the lower electrode with a density of $1.0\times10^6$ to $1.0\times10^8/cm^2$.

According to the ninth aspect, the actuator device thus manufactured has the lower electrode with the convex portions on the protruding portions of the $ZrO_2$ layer. In addition, the actuator device has excellent adhesion between the $ZrO_2$ layer and the underlying base of the $ZrO_2$ layer, such as the substrate, as well as between the $ZrO_2$ layer and the lower electrode.

A tenth aspect of the invention provides the actuator device according to the ninth aspect, in which device, each convex portion has a height of 16.0 to 40.6 nm and a diameter of 0.3 to 0.5 μm when viewed from above, and the protruding portions exist on the lower electrode with a density of $1.11\times10^7$ to $1.25\times10^7/cm^2$.

According to the tenth aspect, the actuator device thus manufactured has the lower electrode with the convex portions on the protruding portions of the $ZrO_2$ layer. In addition, the actuator device has superior adhesion between the $ZrO_2$ layer and the underlying base of the $ZrO_2$ layer, as well as between the $ZrO_2$ layer and the lower electrode.

An eleventh aspect of the invention provides a liquid-jet head that includes the actuator device according to any one of the sixth to tenth aspects as a liquid ejection means for injecting a liquid.

According to the eleventh aspect, the liquid-jet head thus formed employs an actuator that has excellent adhesion between the $ZrO_2$ layer and the underlying base of the $ZrO_2$ layer, such as the substrate, as well as between the $ZrO_2$ layer and the lower electrode. Consequently, the driving of the actuator device does not cause the delamination between the $ZrO_2$ layer and the underlying base of the $ZrO_2$ layer, such as the substrate, as well as between the $ZrO_2$ layer and the lower electrode. As a result, an excellently durable liquid-jet head can be obtained.

BRIEF DESCRIPTION OF THE DRAWINGS

The invention will be described with reference to the accompanying drawings.

DESCRIPTION OF THE PREFERRED EMBODIMENTS

Hereinafter, the invention will be described in detail referring to embodiments.

Embodiment 1

Figure 1:
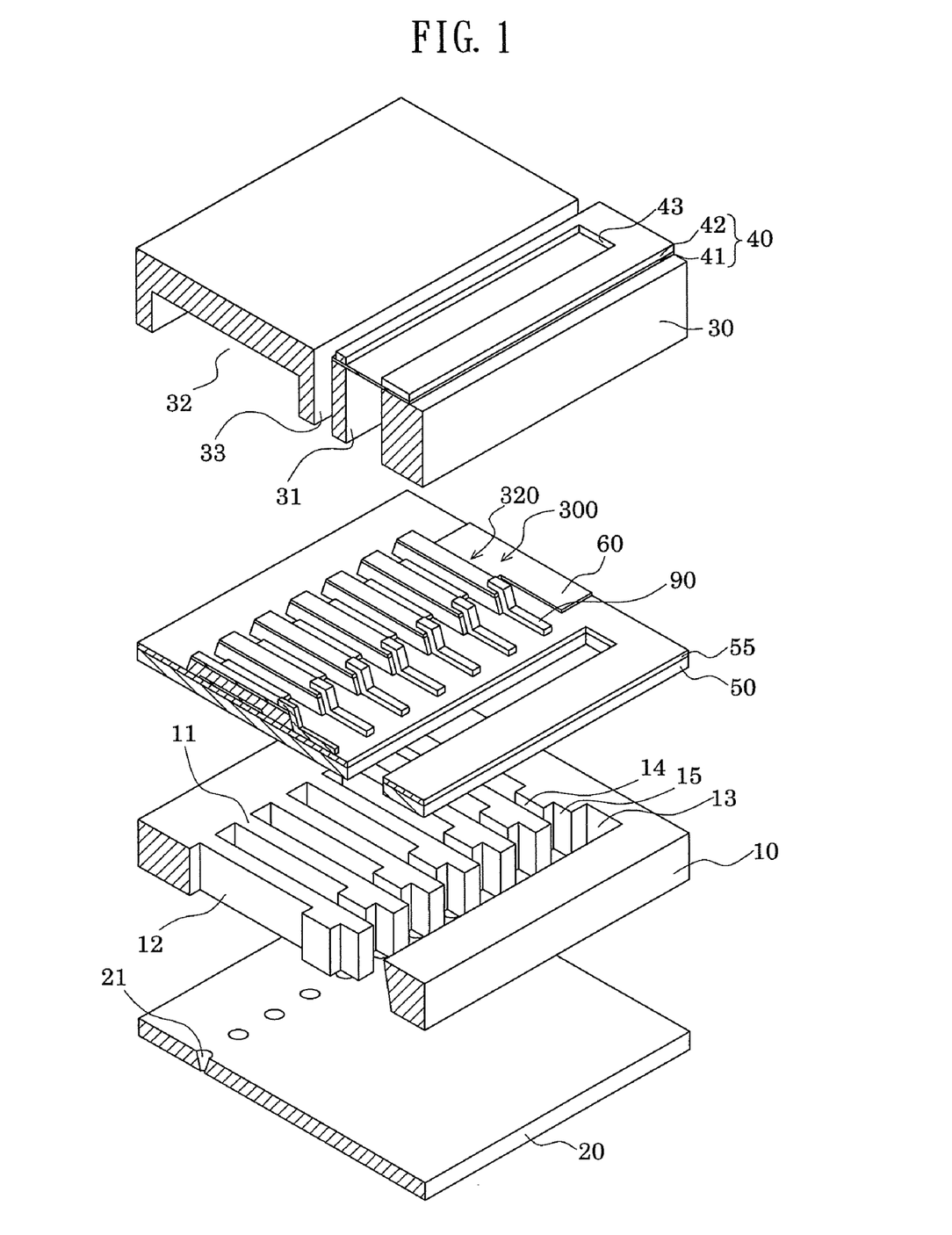
FIG. 1 is an exploded perspective view showing a schematic configuration of a recording head according to Embodiment 1 of the invention.
Figure 2:
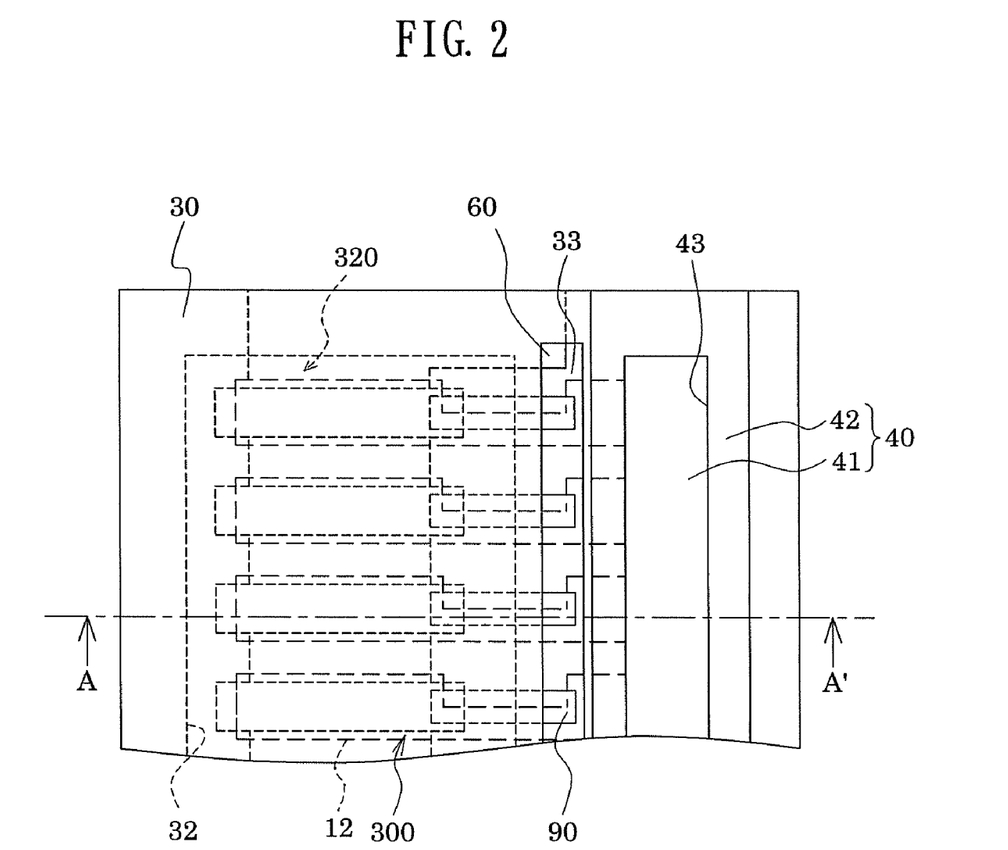
FIG. 2 is a plan view of a principal part of the recording head according to Embodiment 1 of the invention.
Figure 3:
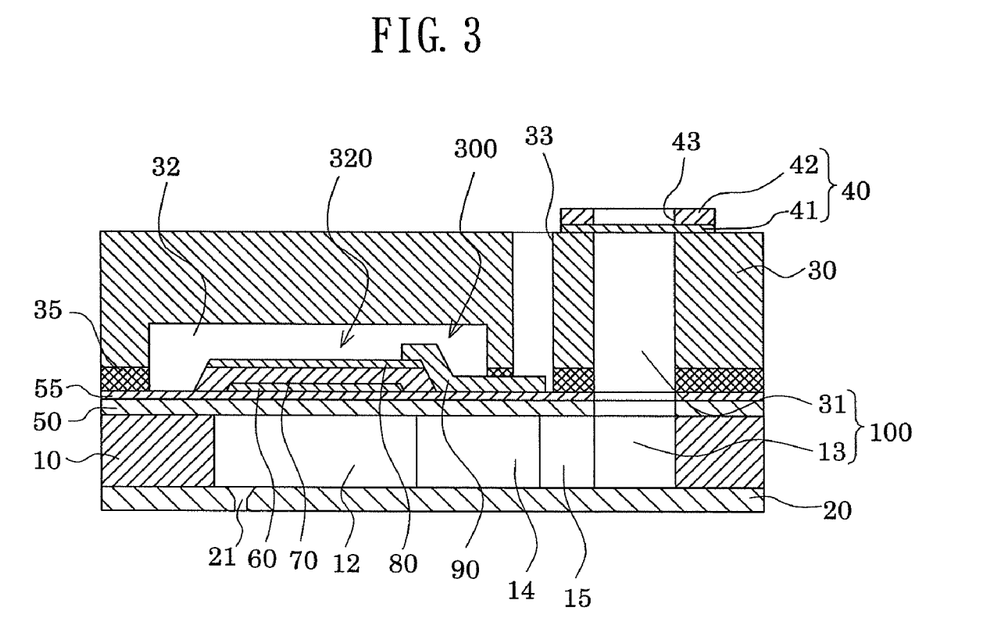
FIG. 3 is an enlarged cross-sectional view of a principal part of the recording head according to Embodiment 1 of the invention.
Figure 4:
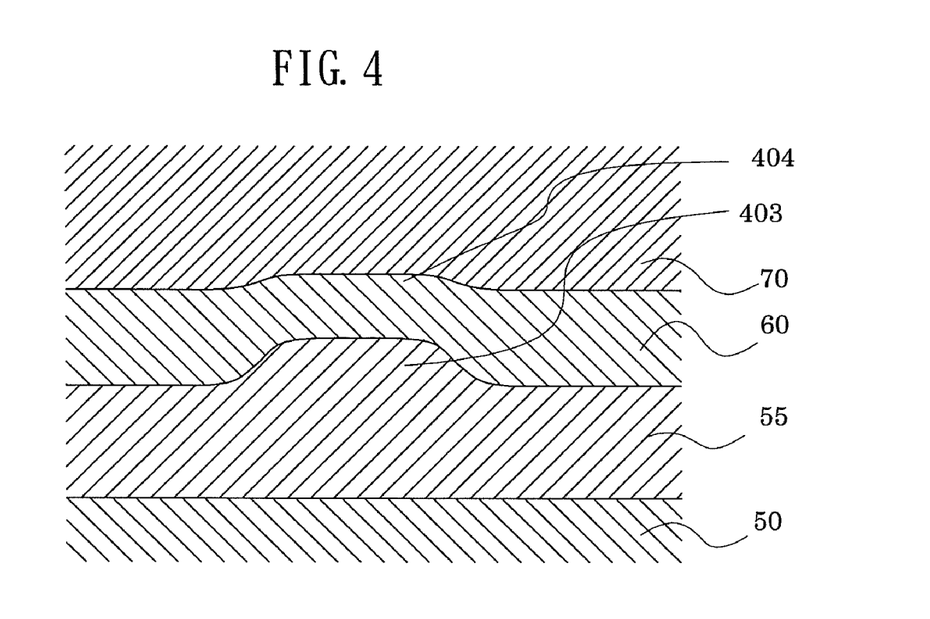
FIG. 4 is an enlarged cross-sectional view of a principal part of the recording head according to Embodiment 1 of the invention.
Figure 5:
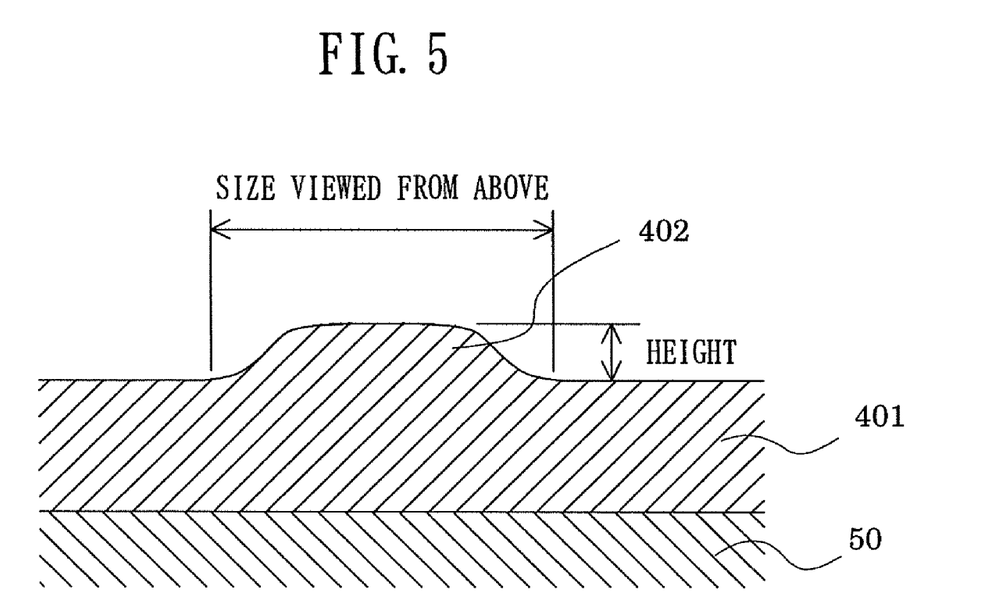
FIG. 5 is an enlarged cross-sectional view of a principal part of a Zr layer.
Figure 6:
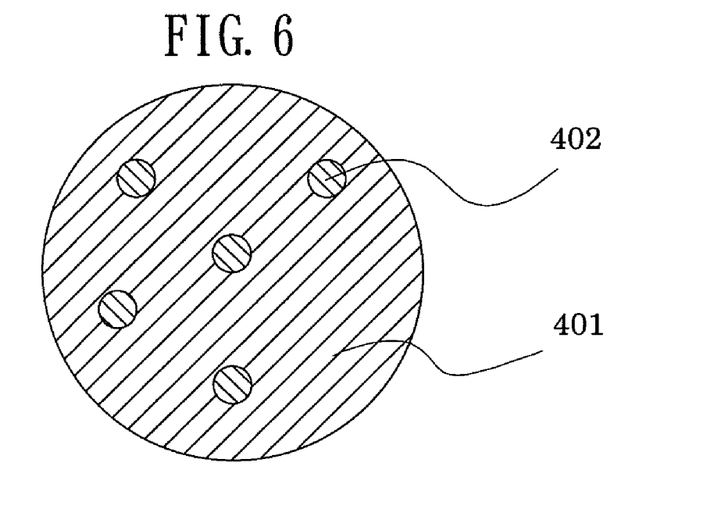
FIG. 6 is an enlarged plan view of a principal part of the Zr layer.

FIG. 1 is an exploded perspective view showing a schematic configuration of an ink-jet recording head that is an example of a liquid-jet head equipped with an actuator device according to Embodiment 1 of the invention. FIG. 2 is a plan view of a principal part of the ink-jet recording head, and FIG. 3 is a cross-sectional view taken along the line A-A' in FIG. 2. FIG. 4 is an enlarged view of a principal part of FIG. 3. FIG. 5 is an enlarged cross-sectional view of a principal part of a zirconium (Zr) layer, which is a precursor of a zirconium oxide ($ZrO_2$) layer. FIG. 6 is an enlarged plan view of a principal part of the Zr layer, which is a precursor of the $ZrO_2$ layer.

Figs. show the following configuration of Embodiment 1. A passage-forming substrate 10 is made of a single-crystal silicon substrate with the (110) crystal plane orientation. On one surface of the passage-forming substrate 10, an elastic film 50 is formed in a thickness of 0.5 μm to 2 μm. A previously performed thermal oxidation produces silicon dioxide ($SiO_2$) that is made into the elastic film 50. In the passage-forming substrate 10, a plurality of pressure-generating chambers 12 are formed side by side in the width direction (the shorter-side direction) thereof. Compartment walls 11 are formed to define the pressure-generating chambers 12. Moreover, on a first end side in the longitudinal direction of each pressure generating chamber 12 of the passage-forming substrate 10, an ink supply path 14 and a communicating path 15 are defined by the compartment wall 11. A communicating portion 13 is formed at first ends in the longitudinal direction of the communicating paths 15. The communicating portion 13 forms a part of a reservoir 100, which serves as a common ink chamber (liquid chamber) for the pressure generating chambers 12. In brief, a liquid passage is formed, in the passage-forming substrate 10, by the pressure-generating chambers 12, the communicating portion 13, the ink supply paths 14, and the communicating paths 15.

Each ink supply path 14 communicates with the first end side in the longitudinal direction of the corresponding one of the pressure generating chambers 12, and, in addition, has a cross-sectional area smaller than that of each pressure generating chamber 12. In the example of this embodiment, of the passage between each pressure generating chamber 12 and the reservoir 100, the portion on the side near the pressure generating chamber 12 is narrowed in the width direction to form the ink supply path 14 in a width narrower than the width of the pressure generating chamber 12. Note that, each ink supply path 14 is formed by narrowing down the corresponding passage only from one of the two sides in the width direction thereof in this embodiment. The ink supply path 14, however, may be formed by narrowing down the passage from both sides in the width direction. Alternatively, each ink supply path 14 may be formed by narrowing down the corresponding passage not in the width direction but in the thickness direction of the passage. In addition, each communicating path 15 communicates with the corresponding ink supply path 14, to be more precise, the opposite side of the ink supply path 14 from the pressure generating chamber 12. When the cross sections are taken along the width direction of the communicating path 15 and of the ink supply path 14, the communicating path 15 has a larger area than the ink supply path 14 does. The communicating path 15 in this embodiment is formed in the same cross-sectional area as that of the pressure generating chamber 12. To summarize, in the passage-forming substrate 10, the pressure generating chambers 12, the ink supply paths 14, and the communicating paths 15 are formed by being defined by the plurality of compartment walls 11. Here, each ink supply path 14 has a smaller cross-sectional area in the shorter-side direction of each pressure generating chamber 12 than that of each pressure generating chamber 12. The communicating paths 15 communicate with respective ink supply paths 14. In addition, the cross-sectional area of each communication path 15 in the shorter-side direction of each ink supply path 14 is larger than each ink supply path 14, and as large as that of each pressure generating chamber 12.

A nozzle plate 20, in which nozzle orifices 21 are drilled, is fixed to a side of the passage-forming substrate 10 (hereinbelow, referred to as the orifice-side surface) with an adhesive agent, a thermal adhesive film, or the like. Each nozzle orifice 21 communicates with a vicinity of an end portion of the corresponding pressure-generating chamber 12, and the end portion is located on the opposite side of the pressure-generating chamber 12 from the ink supply path 14. Note that, the nozzle plate 20 is made of a glass ceramic material, a single-crystal silicon substrate, a stainless steel or the like, which has a thickness of, for example, 0.01 mm to 1 mm, a linear expansion coefficient of, for example, 2.5 ($\times 10^{-6}$/° C.) to 4.5 ($\times 10^{-6}$/° C.) at a temperature of 300° C. or less.

In addition, on the opposite side of the passage-forming substrate 10 from the orifice-side surface, the above-described elastic film 50, made of silicon dioxide is formed in a thickness of, for example, approximately 1.0 μm. On the elastic film 50, a layer made of zirconium oxide ($ZrO_2$) is formed in a thickness of, for example, approximately 0.3 μm to 0.4 μm. Hereinafter this layer is referred to as a $ZrO_2$ layer 55.

Moreover, piezoelectric elements 300 are formed on the $ZrO_2$ layer 55. The piezoelectric elements 300 are composed of a lower electrode film 60, piezoelectric layers 70, and upper electrode films 80. The lower electrode film 60 has a thickness of, for example, approximately 0.1 μm to 0.2 μm. Each piezoelectric layer 70 has a thickness of, for example, approximately 0.5 μm to 5 μm, and each upper electrode film 80 has a thickness of, for example, approximately 10 nm to 200 nm.

Here, each piezoelectric element 300 is a part including the lower electrode film 60, the corresponding piezoelectric layer 70 and the corresponding upper electrode film 80. In general, the piezoelectric element 300 is formed by using any one of the two electrodes of the piezoelectric element 300 as a common electrode, and then by patterning the other one of these electrodes and the piezoelectric layer 70 for each pressure-generating chamber 12. In a portion constituted of a patterned one of the two electrodes, and a patterned piezoelectric layers 70 when a voltage is applied to the two electrodes, a piezoelectric strain occurs. This portion is called a piezoelectric active portion 320 here. In this embodiment, the lower electrode film 60 is used as the common electrode of the piezoelectric elements 300 while the upper electrode films 80 are used as individual electrodes of the corresponding piezoelectric elements 300. However, the functions of the lower electrode film 60 and of the upper electrode films 80 may be reversed to meet the need of a drive circuit or wirings. In any case, each of the piezoelectric active portions 320 is formed for each of the pressure-generating chambers 12. FIG. 3 shows that the lower electrode film 60, the piezoelectric layer 70, and the upper electrode film 80 in this embodiment are patterned so as to make the width of the upper-electrode-film 80 side narrower than that of the lower-electrode-film 60 side. The patterned side surfaces of these films and layer are made inclined. Incidentally, driving the piezoelectric element 300 causes a displacement of a vibration plate. The vibration plate and the piezoelectric element 300 are collectively referred to as an actuator device. In the above-described example, the elastic film 50, the $ZrO_2$ layer 55, and the lower electrode film 60 together serve as the vibration plate, but this is not the only form of the vibration plate. The $ZrO_2$ layer 55 and the lower electrode film 60 alone may serve as the vibration plate without forming an elastic film 50.

In this embodiment of the invention, the $ZrO_2$ layer 55 is formed by oxidizing a layer made of zirconium (Zr)—Zr layer 401—formed on the elastic film 50 on the passage-forming substrate 10. The enlarged cross-sectional view (FIG. 5) and the enlarged plan view (FIG. 6) of a principal part of the Zr layer 401 show that the film of the Zr layer 401 is formed through crystal growth of Zr so that protruding special crystal regions 402 are formed. The special crystal regions 402 protrude to the opposite side surface of the Zr layer 401 from the passage-forming substrate 10, that is, to the side where the lower electrode film 60 is to be formed. Each of the protruding special crystal regions 402 has a height of 10 to 100 nm and a diameter of 0.1 to 1 μm when viewed from above. The special crystal regions 402 are distributed with a density of $1.0 \times 10^6$ to $1.0 \times 10^8/cm^2$ on the surface of the Zr layer 401. It is preferable that the height be 16.0 to 40.6 nm; the diameter, 0.3 to 0.5 μm; and the density, $1.11 \times 10^7$ to $1.25 \times 10^7/cm^2$. When Zr crystals are made to grow from the elastic-film 50 side to form the Zr layer 401, parts of Zr crystals grow higher in the thickness direction of the Zr layer than those in the other regions. The crystals that have grown higher form the special crystal regions 402. In this respect, the special crystal regions 402 differ from protruding regions formed in other ways. For example, protruding regions of Zr crystals can be formed by first forming a flat Zr layer, and then forming another layer of Zr crystals in some parts of the flat Zr layer. Alternatively, protruding regions of Zr crystals can be formed by patterning the surface of a Zr layer having been formed as a flat layer. The protruding regions of Zr crystals that are formed in these ways are not the same as the special crystal regions 402. In addition, the special crystal regions 402 are made of crystals with columnar crystals of Zr each of which has a grain size of approximately 20 to 100 nm, and in each of which the degree of the (002) plane orientation is not less than 70%. The degree of orientation mentioned-above means the diffraction-intensity ratio of the Zr layer measured by a wide-angle X-ray diffraction method. Specifically, the degree of the (002) plane orientation is defined as follows. When the Zr layer is measured by a wide-angle X-ray diffraction method, peaks of diffraction intensity corresponding to the (100) plane, the (002) plane, and (101) plane can be observed. The ratio of the peak intensity for the (002) plane to the sum of the peaks for all these planes is the degree of the (002) plane orientation.

With this $ZrO_2$ layer 55, excellent adhesion can be obtained between the $ZrO_2$ layer 55 and the elastic film 50 made of silicon dioxide, which lies under the $ZrO_2$ layer 55. In addition excellent adhesion can also be obtained between the $ZrO_2$ layer 55 and the lower electrode film 60, which is formed on top of the $ZrO_2$ layer 55. As a consequence, such excellent adhesion prevents delamination of the elastic film 50, or of the lower electrode film 60, from the $ZrO_2$ layer 55, from occurring when the actuator device is driven.

The $ZrO_2$ layer 55 is formed by oxidizing the Zr layer 401 with the special crystal regions 402 protruding from the surface of the Zr layer 401. For this reason, the $ZrO_2$ layer 55 has protruding portions 403, as shown in FIG. 4, which are formed by oxidizing the special crystal regions 402, on the surface of the lower-electrode-film 60 side. Each of the protruding portions 403 has a height of 10 to 100 nm and a diameter of 0.1 to 1 μm when viewed from above. The protruding portions 403 are distributed with a density of $1.0 \times 10^6$ to $1.0 \times 10^8/cm^2$ on the surface of the $ZrO_2$ layer 55. It is preferable that the height be 16.0 to 40.6 nm; the diameter, 0.3 to 0.5 μm; and the density, $1.11 \times 10^7$ to $1.25 \times 10^7/cm^2$. In addition, the $ZrO_2$ layer 55 in this embodiment is made of columnar crystals each of which has a grain size of approximately 20 to 100 nm, and each of which has a priority orientation of the (−111) plane.

The lower electrode film 60, which is formed on top of the $ZrO_2$ layer 55, which has the protruding portions 403, has convex portions 404, as shown in FIG. 4. The convex portions 404 derive from the protruding portions 403 of the $ZrO_2$ layer 55 and protrude from the surface of the piezoelectric-layer 70 side. Each of the convex portions 404 of the lower electrode film 60 has a height of 10 to 100 nm and a diameter of 0.1 to 1 μm when viewed from above. The convex portions 403 are distributed with a density of $1.0 \times 10^6$ to $1.0 \times 10^8/cm^2$ on the surface of the lower electrode film 60. It is preferable that the height be 16.0 to 40.6 nm; the diameter, 0.3 to 0.5 μm; and the density, $1.11 \times 10^7$ to $1.25 \times 10^7/cm^2$.

Examples of the material for the lower electrode film 60 of this embodiment are various metals, such as iridium (Ir), platinum (Pt), titanium (Ti), and tungsten (W), or alloys of these metals. In addition, examples of the material for the piezoelectric layer 70 (piezoelectric material), which constitutes the piezoelectric element 300 in this embodiment, are ferroelectric piezoelectric materials, such as lead zirconate titanate (PZT), and relaxor ferroelectrics, which are ferroelectric piezoelectric materials with addition of such metals as niobium (Nb), nickel (Ni), magnesium (Mg), bismuth (Bi), and yttrium (Y). Examples of the composition of such materials are $PbTiO_3$ (PT), $PbZrO_3$ (PZ), $Pb(Zr_xTi_{1-x})O_3$(PZT), $Pb(Mg_{1/3}Nb_{2/3})O_3$—$PbTiO_3$(PMN-PT), $Pb(Zn_{1/3}Nb_{2/3})$ O$_3$—PbTiO$_3$ (PZN-PT), Pb(Ni$_{1/3}$Nb$_{2/3}$)O$_3$—PbTiO$_3$(PNN-PT), Pb(In$_{1/2}$Nb$_{1/2}$)O$_3$—PbTiO$_3$ (PIN-PT), Pb(Sc$_{1/2}$Ta$_{1/2}$)O$_3$—PbTiO$_3$(PST-PT), Pb(Sc$_{1/2}$Nb$_{1/2}$)O$_3$—PbTiO$_3$ (PSN-PT), BiScO$_3$—PbTiO$_3$(BS-PT), BiYbO$_3$—PbTiO$_3$(By-PT). In addition, as the material for the upper electrode film 80, any one of such metals as Ir, Pt, W, tantalum (Ta), and molybdenum (Mo). Alloys of these metals and such metal oxides as iridium oxide may also be used.

Lead electrodes 90, made of, for example, gold (Au), are connected to the respective upper electrode films 80, which is the individual electrodes for the piezoelectric elements 300. Each lead electrode 90 is drawn out from the vicinity of the end portion on the ink-supply-passage 14 side of the corresponding piezoelectric element 300, and extends to reach the top surface of the ZrO$_2$ layer 55. A voltage is selectively applied to the piezoelectric elements 300 through these lead electrodes 90.

In addition, a protective plate 30 is bonded, with an adhesive agent 35, to the passage-forming substrate 10 with the piezoelectric elements 300 formed thereon. The protective plate 30 has a piezoelectric element holding portion 32 in a region facing the piezoelectric elements 300. The piezoelectric element holding portion 32 has only to be a space large enough to allow an unobstructed movement of the piezoelectric elements 300. The space may either be sealed or may not be sealed.

In addition a reservoir portion 31 is formed in the protective plate 31, specifically in a region thereof facing the communicating portion 13. The reservoir portion 31, as described above, communicates with the communicating portion 13 of the passage-forming substrate 10. The reservoir portion 31 and the communicating portion 13 form the reservoir 100, which is a common ink chamber for all the pressure-generating chambers 12. A penetrated hole 33, which penetrates the protective plate 30 in the thickness direction thereof, is formed in a region of the protective plate 30 between the piezoelectric element holding portion 32 and the reservoir portion 31. Inside the penetrated hole 33, a part of each lower electrode film 60 and a head end portion of each lead electrode 90 are exposed.

In addition, an unillustrated drive circuit for driving the piezoelectric elements 300 is fixed onto the protective plate 30. The drive circuit and each lead electrode 90 are electrically connected to each other with connection wiring, which is formed of a conductive wire such as a bonding wire.

As the material of the protective plate 30, preferably used is a material having substantially the same thermal expansion coefficient as that of the passage-forming substrate 10, for example, glass or a ceramic material. In this embodiment, the protective plate 30 is made of a single-crystal silicon substrate which is the same material as that of the passage-forming substrate 10.

A compliance plate 40, composed of a sealing film 41 and a fixing plate 42, is joined onto the protective plate 30. The sealing film 41 is made of a flexible material with a low rigidity, for example, a polyphenylene sulfide (PPS) film with a thickness of 6 μm. One side of the reservoir portion 31 is sealed with the sealing film 41. Meanwhile, the fixing plate 42 is made of a hard material such as a metal, for example, stainless steel (SUS) or the like with a thickness of 30 μm. In a region, facing the reservoir 100, of the fixing plate 42, an opening portion 43 is formed by removing the corresponding part of the fixing plate 42 completely in the thickness direction. Accordingly, that side of the reservoir 100 is sealed only by the flexible sealing film 41.

In the ink-jet recording head of this embodiment with features described above, an ink is taken in from an unillustrated external ink supply means, and the inside of the portion from the reservoir 100 to the nozzle orifices 21 is filled with the ink. Then, in response to a recording signal from the drive circuit, a voltage is applied between the lower electrode film 60 and the upper electrode film 80 of the pressure-generating chamber 12 that corresponds to the recording signal. The elastic film 50, the ZrO$_2$ layer 55, the lower electrode film 60, and the corresponding piezoelectric layer 70 are flexurally deformed so that the pressure in the pressure-generating chamber 12 is increased. Eventually, an ink droplet is ejected from the corresponding nozzle orifice 21. In this embodiment, the adhesion between the ZrO$_2$ layer 55 and the lower electrode film 60 as well as between the ZrO$_2$ layer 55 and the elastic film 50 is so strong that a flexure deformation caused by the drive of the actuator device may cause no delamination of the lower electrode film 60, or of the elastic film 50, from the ZrO$_2$ layer 55. In other words, the ink-jet recording head has excellent durability.

Figure 7A:
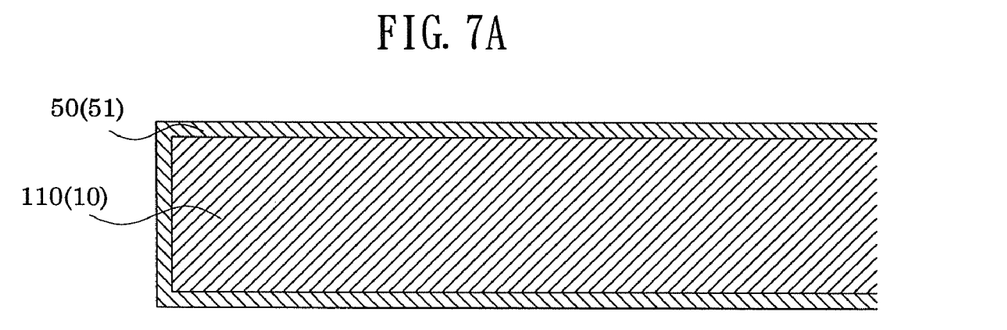
FIGS. 7A to 7C are cross-sectional views each showing a process of manufacturing the recording head according to Embodiment 1.

Hereinafter, a method of fabricating the above-mentioned ink-jet recording head will be described with reference to FIG. 7 to FIG. 11. Each of FIG. 7 to FIG. 11 is a cross-sectional view taken along the longitudinal direction of the pressure-generating chamber 12. Firstly, as shown in FIG. 7A, a wafer 110 for a passage-forming substrate, which is a silicon wafer, is thermally oxidized in a diffusion furnace at a temperature of approximately 1100° C. so as to form a silicon dioxide film 51 which constitutes the elastic film 50, on the surface of the wafer 110. Note that, in this embodiment, a relatively thick (approximately 625 μm), rigid silicon wafer is used as the wafer 110 for the passage-forming substrate.

Figure 7B:
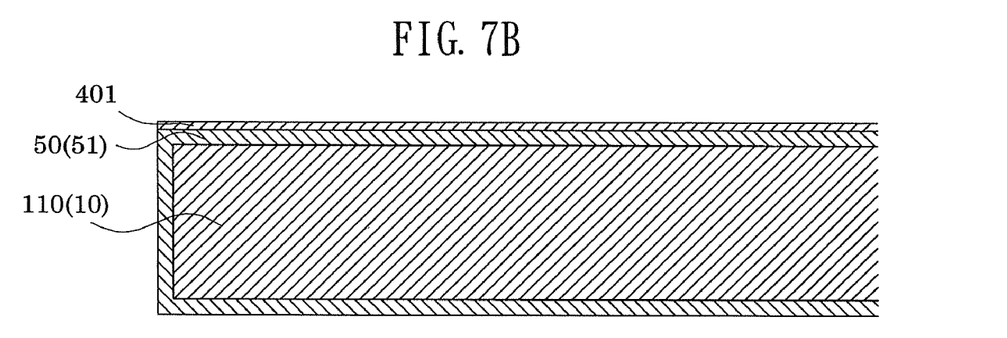

Next, as shown in FIG. 7B, the Zr layer 401 is formed on top of the elastic film 50 (the silicon dioxide film 51). The Zr layer 401 is formed through crystal growth of Zr so that the special crystal regions 402 protrude from the surface on the side where the lower electrode film 60 is to be formed. Each of the special crystal regions 402 is formed to have a height of 10 to 100 nm, and a diameter of 0.1 to 1 μm when viewed from above. In addition, the special crystal regions 402 are distributed with a density of $1.0 \times 10^6$ to $1.0 \times 10^8$/cm$^2$. It is preferable that the height be 16.0 to 40.6 nm; the diameter, 0.3 to 0.5 μm; and the density, $1.11 \times 10^7$ to $1.25 \times 10^7$/cm$^2$. The special crystal regions 402 can be formed as follows. The Zr layer 401 is formed through the crystal grow of Zr from the elastic-film 50 side so as to have regions in which Zr crystals grow preferentially in the thickness direction of the Zr layer 401 than ordinary Zr crystals do. The crystals that have grown higher in this way form the special crystal regions 402.

Specifically, the Zr layer 401 in which the special crystal regions 402 are formed can be formed by a DC sputtering under the following conditions that have to be balanced. The temperature at film-formation is in a range between the room temperature (23° C.) and 300° C., inclusive; the Ar pressure at film-formation, not more than 1 Pa; the power density of the output, 3 to 30 kW/m$^2$; the distance between the target (Zr) and the elastic film 50, 60 to 180 mm. For example, though other conditions may affect the consequence, a higher temperature at film-formation produces special crystal regions each with a larger diameter when viewed from above while a lower Ar pressure facilitates the formation of the special crystal region 402. In addition, though other conditions may affect the consequence, a higher degree of (002) plane orientation of the Zr layer 401, for example, 70% or higher, facilitates the formation of the special crystal region 402.

Figure 7C:
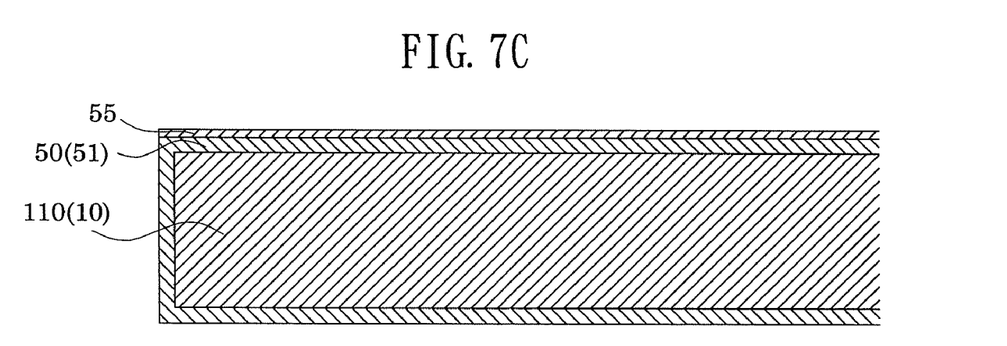

After the formation of the Zr layer 401, this Zr layer 401 is thermally oxidized to form ZrO$_2$ layer 55 as shown in FIG. 7C. In this embodiment, the ZrO$_2$ layer 55 is formed by thermally oxidizing the Zr layer 401 in a diffusion furnace at a temperature of, for example, 500° C. to 1200° C. In addition, the Zr layer 401 in this embodiment is oxidized by a dry oxidation, but the Zr layer 401 may be oxidized by a wet oxidation. In the $ZrO_2$ layer 55 formed in this way, the protruding portions 403 shown in FIG. 4 are formed through the oxidation of the special crystal regions 402 of the Zr layer 401. The height, the size, and the density of the protruding portions 403 of the $ZrO_2$ layer 55 reflect those of the special crystal regions 402 of the Zr layer 401. The height is 10 to 100 nm, and the diameter is 0.1 to 1 μm when viewed from above. In addition, the protruding portions 403 are distributed on the surface of the $ZrO_2$ layer 55 with a density of $1.0 \times 10^6$ to $1.0 \times 10^8/cm^2$.

Figure 8A:
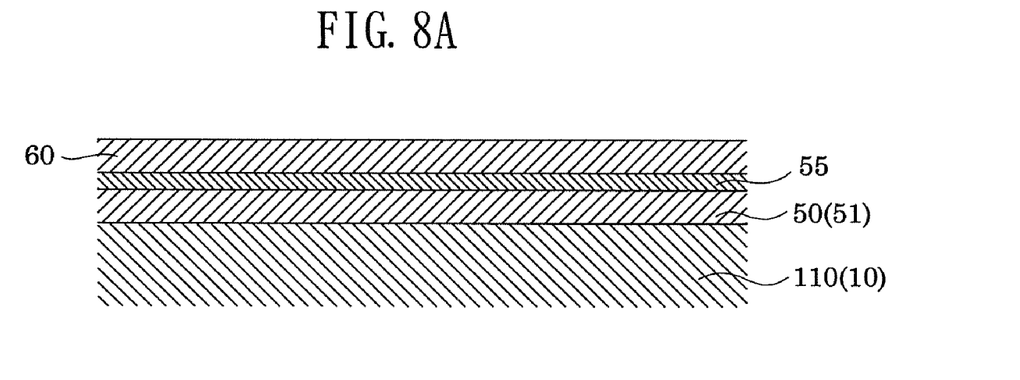
FIGS. 8A to 8C are cross-sectional views each showing a process of manufacturing the recording head according to Embodiment 1.

Thereafter, as shown in FIG. 8A, the lower electrode film is formed by forming layers of titanium (Ti), platinum (Pt), and iridium (Ir) on the $ZrO_2$ layer 55 by a sputtering method or the like. In the lower electrode film 60 formed in this way, convex portions 404 are formed on the protruding portions 403 of the $ZrO_2$ layer 55 as shown in FIG. 4. The height, the size, and the density of the convex portions 404 of the lower electrode film 60 depend on the conditions at the formation of the lower electrode film 60, as well as reflect the height, the size, and the density of the protruding portions 403 of the $ZrO_2$ layer 55. For example, when the lower electrode film 60 is formed using a DC sputtering method, with the temperature at film-formation being 23 to 100° C.; the Ar pressure at film-formation, 0.3 to 1 Pa; the power density of the output, 3 to 30 $kW/m^2$, each of the convex portions 404 is formed to have a height of 10 to 100 nm and a diameter of 0.1 to 1 μm when viewed from above. In addition, the convex portions 404 are distributed on the surface of the lower electrode film 60 with a density of $1.0 \times 10^6$ to $1.0 \times 10^8/cm^2$.

Next, the piezoelectric layer 70, made of lead zirconate titanate (PZT) or the like, is formed on the lower electrode film 60. In this embodiment, the piezoelectric layer 70 is formed by what is termed a sol-gel method. In the sol-gel method, a so-called sol obtained by dissolving and dispersing a metal-organic compound in a solvent is turned into a gel through applying and drying processes. Thereafter, the gel is baked at a high temperature, and thus the piezoelectric layer 70 made of a metal oxide is obtained. Note that the method of forming the piezoelectric layer 70 is not limited to the sol-gel method. For example, a Metal-Organic Decomposition (MOD) method or other sputtering methods may be employed for the purpose.

Figure 8B:
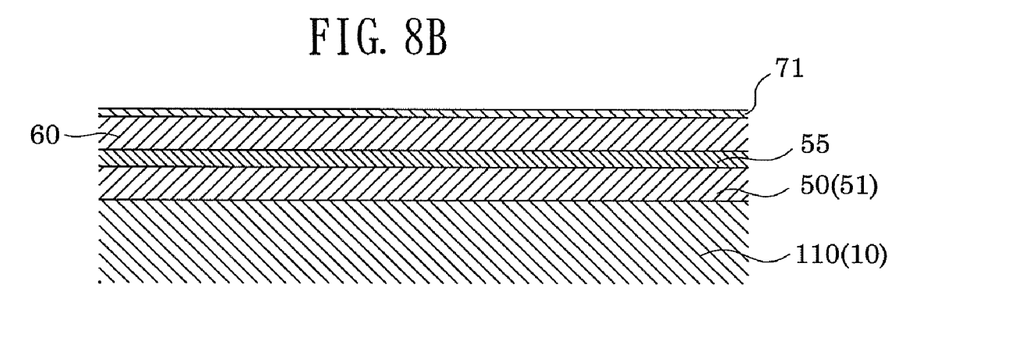

Now, a specific procedure of forming the piezoelectric layer 70 will be described. First, as shown in FIG. 8B, a piezoelectric precursor film 71, which is a PZT precursor film, is formed on the lower electrode film 60. To be more specific, a sol (solution) containing a metal-organic compound (lead titanate zirconate) is applied, by a spin-coat method or the like, onto the lower electrode film 60, which has been formed on the passage-forming substrate 10 (application process). Next, this piezoelectric precursor film 71 is heated to a predetermined temperature, and thus dried for a certain period of time (drying process). Then, the piezoelectric precursor film 71 thus dried is heated to a predetermined temperature, and is then maintained at this predetermined temperature for a certain period of time so as to be dewaxed (dewaxing process). Note that the dewaxing means here making the organic constituents included in the piezoelectric precursor film 71 be removed in such forms as $NO_2$, $CO_2$, and $H_2O$.

Figure 8C:
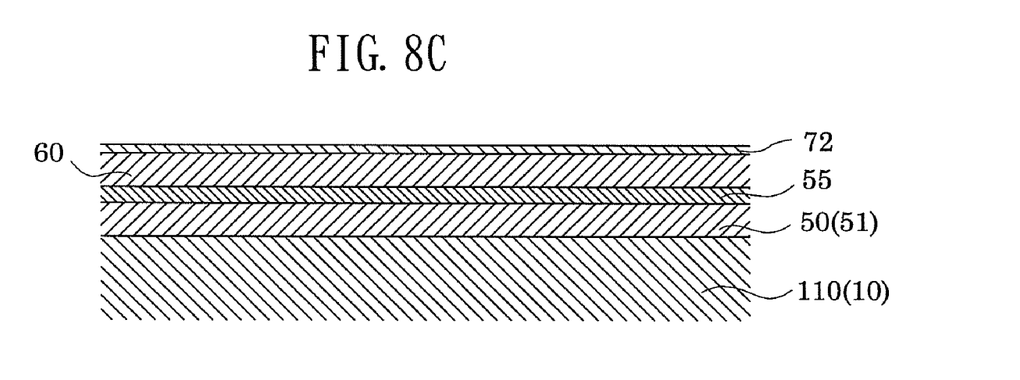

Subsequently, as shown in FIG. 8C, the piezoelectric precursor film 71 is again heated to a predetermined temperature, and is maintained at the predetermined temperature for a certain period of time so as to be crystallized. As a result, a piezoelectric film 72 is formed (baking process). Examples of a heating device that can be used for the drying, dewaxing, and baking processes are a hot plate, and a rapid thermal annealing (RTA) apparatus in which heating is carried out by the radiation of an infrared lamp.

Figure 9A:
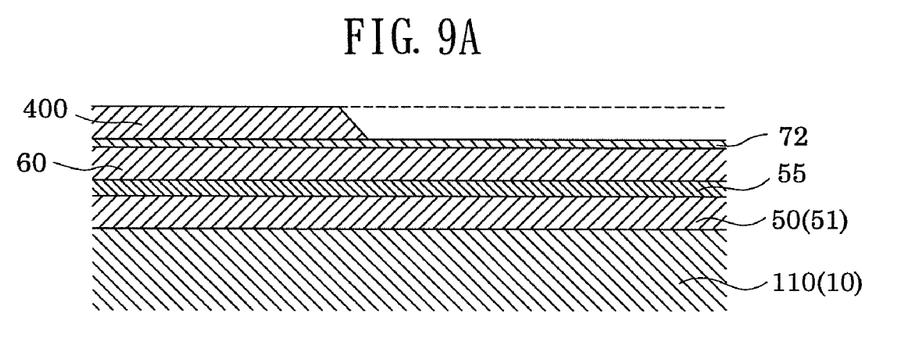
FIGS. 9A to 9C are cross-sectional views each showing a process of manufacturing the recording head according to Embodiment 1.
Figure 9B:
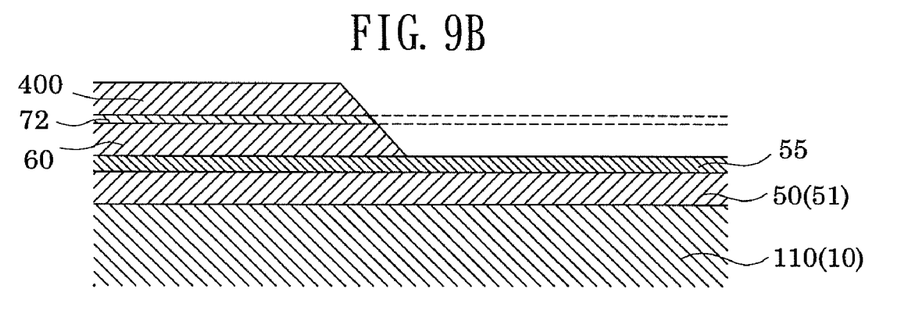

Then, as shown in FIG. 9A, a resist 400 is formed, in a predetermined shape, on the piezoelectric film 72. A simultaneous patterning of the lower electrode film 60 and a first layer of the piezoelectric film 72 follows using the resist 400 as a mask. Through the patterning, an inclined surface is formed by the side faces of these films 60 and 72, as shown in FIG. 9B.

Figure 9C:
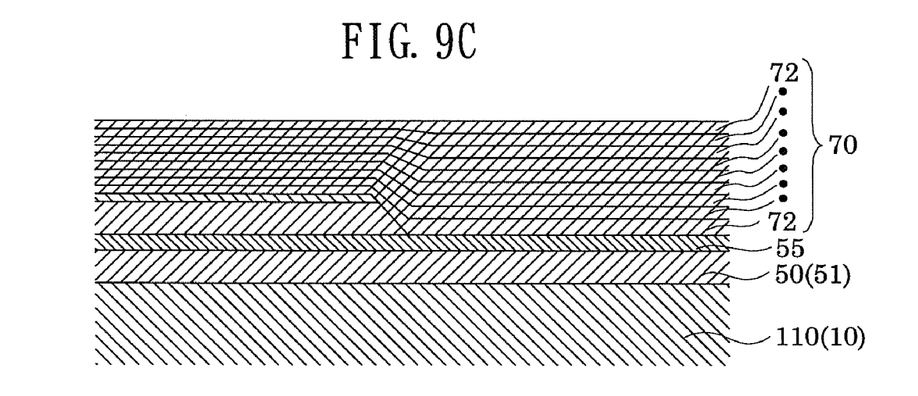

Subsequently, the resist 400 is removed. Thereafter, the piezoelectric-film forming process, including the application, the drying, the dewaxing, and the baking processes, is repeated for a plurality of times to form the piezoelectric layer 70 including a plurality of piezoelectric films 72. As shown in FIG. 9C, the piezoelectric layer 70 thus formed includes the plurality of piezoelectric films 72, and has a predetermined thickness. For example, the thickness of a film formed by each application of the sol is made extremely thin, and thus the piezoelectric layer 70 including the plurality of piezoelectric films 72 has a total thickness of approximately 1 to 3 μm. Note that the piezoelectric layer 70 in this embodiment is formed by forming layers of piezoelectric films 72. The piezoelectric layer 70, however, may be formed of only a single layer of the piezoelectric film 72 with a larger thickness. The piezoelectric layer thus obtained is a flat layer, and no protruding region exists.

Figure 10A:
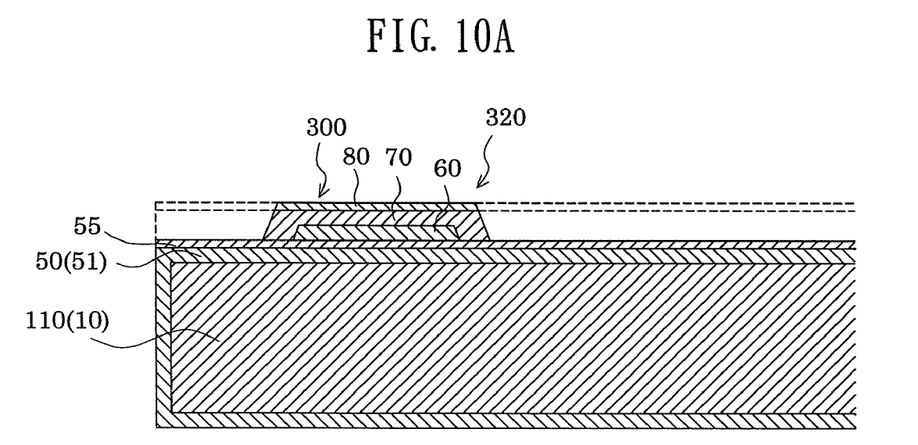
FIGS. 10A to 10C are cross-sectional views each showing a process of manufacturing the recording head according to Embodiment 1.

After the piezoelectric layer 70 is formed, the upper electrode film 80 made of iridium (Ir) is formed over the entire top surface of the piezoelectric layer 70 by, for example, a sputtering method. Then, the piezoelectric layer 70 and the upper electrode film 80 are patterned into regions respectively facing the pressure-generating chambers 12. The piezoelectric elements 300 are formed in this way. Note that the piezoelectric layer 70 and the upper electrode film 80 can be patterned together at a single process of dry etching using a resist (not illustrated) formed in a predetermined shape. In such a dry etching, use of a resist with inclined side faces makes the widths of the piezoelectric layer 70 and the upper electrode film 80 thus patterned decrease gradually towards the upper-electrode-film 80 side. The side faces of the piezoelectric layer 70 and of the upper electrode film 80 formed in this way form inclined surfaces.

Figure 10B:
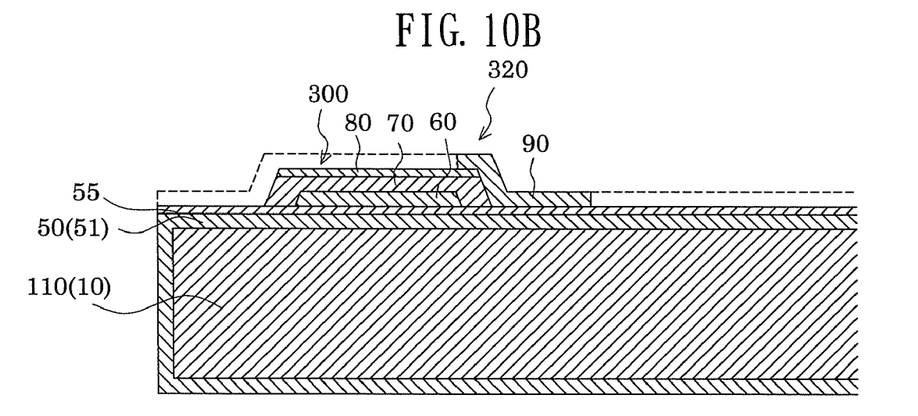

Next, as shown in FIG. 10B, the lead electrode 90, which is, for example, made of gold (Au) is formed over the entire surface of the wafer 110 for the passage-forming substrate. Then, the lead electrode 90 is patterned for each piezoelectric element 300, by using a mask pattern (not illustrated) formed of a resist or the like.

Figure 10C:
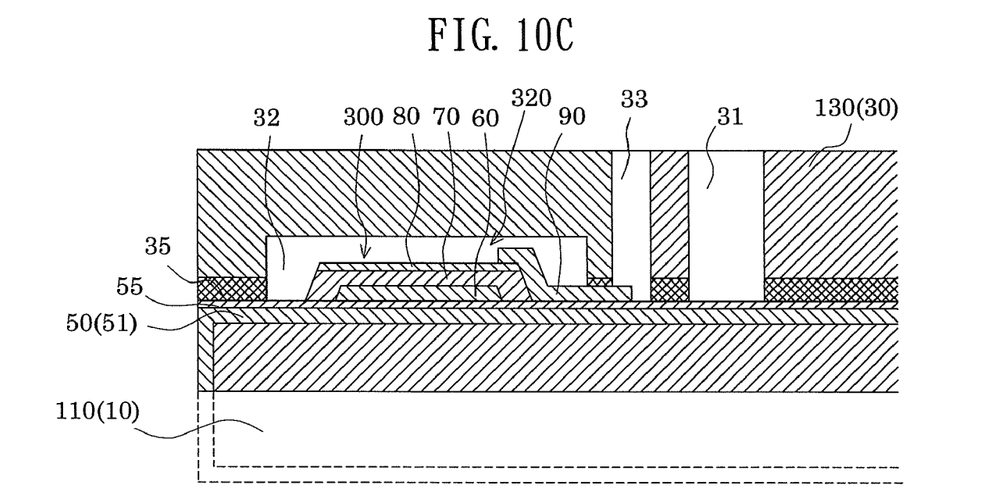

Thereafter, as shown in FIG. 10C, a wafer 130 for a protective plate is bonded to the piezoelectric elements 300 side of the wafer 110 for the passage-forming substrate with the adhesive agent 35. The wafer 130 for the protective plate is a silicon wafer, and is to be formed into a plurality of the protective plates 30. Note that, the bonding of the wafer 130 for the protective plate, which has a thickness of, for example, approximately several hundreds of micrometers, significantly improves the rigidity of the wafer 110 for the passage-forming substrate.

Figure 11A:
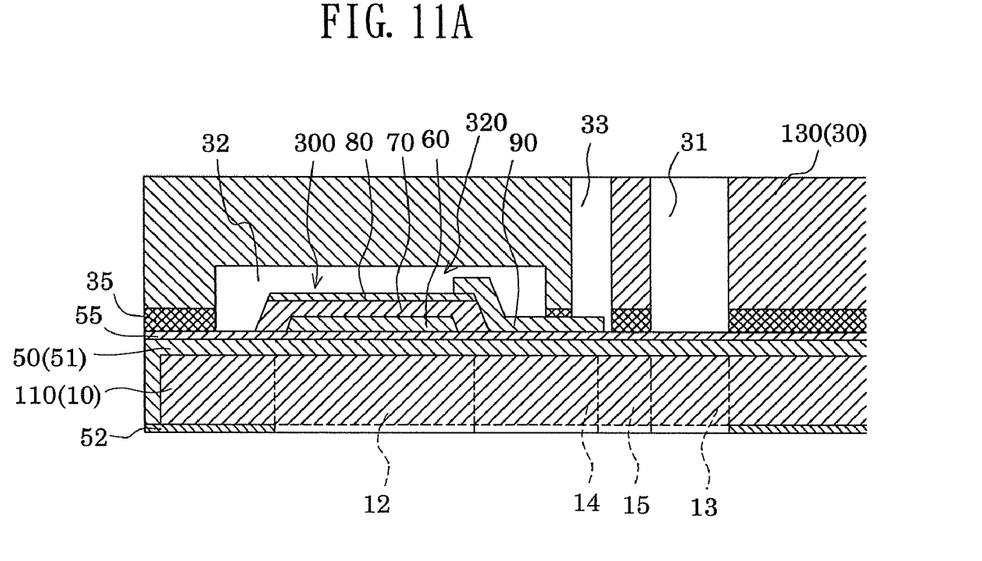
FIGS. 11A and 11B are cross-sectional views each showing a process of manufacturing the recording head according to Embodiment 1.

Then, as shown in FIG. 11A, the wafer 110 for the passage-forming substrate is made thinner so as to have a certain thickness. In addition, a mask film 52 is newly formed on the wafer 110 for the passage-forming substrate, and is then patterned into a predetermined shape.

Figure 11B:
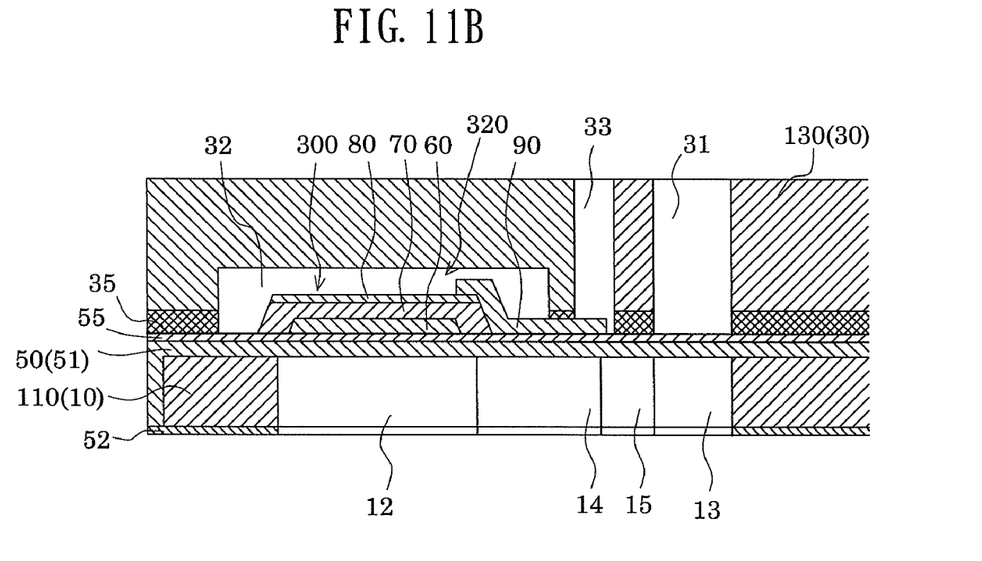

Then, as shown in FIG. 11B, an anisotropic etching (wet etching) using an alkaline solution, such as KOH, is performed on the wafer 110 for the passage-forming substrate using the mask film 52. As a result, the pressure-generating chambers 12 which respectively correspond to the piezoelectric elements 300, the communicating portion 13, the ink supply paths 14 and the communicating paths 15, are formed.

After that, unnecessary parts of the outer peripheral portions of the wafer 110 for the passage-forming substrate and of the wafer 130 for the protective plate are cut off and removed by, for example, dicing. Then, the silicon dioxide film 51 is removed from the opposite surface of the wafer 110 for the passage-forming substrate from the wafer 130 for the protective plate. Thereafter, the nozzle plate 20 having the nozzle orifices 21 drilled therein is bonded to the surface from which the silicon dioxide film 51 has been removed. Moreover, the compliance plate 40 is bonded to the surface of the wafer 130 for the protective plate. Furthermore, the wafer 110 for the passage-forming substrate and the like are divided into pieces of passage-forming substrates 10 and the like, each piece of which has a single chip size as shown in FIG. 1. In this way, the ink-jet recording head of this embodiment is fabricated.

Hereinafter, more detailed descriptions will be provided using Examples and Comparative Examples.

EXAMPLE 1

An actuator device was fabricated in accordance with the embodiment described thus far. Specifically, a $SiO_2$ film of a 1 μm thickness was formed on a silicon substrate. A Zr layer of a 270 nm thickness was formed on the $SiO_2$ film by a DC sputtering method under the following conditions at film formation: the Ar pressure at film formation was 0.5 Pa; the power density of the output, 15 $kW/m^2$; the temperature at film formation, room temperature (23° C., expressed as "RT" in the following tables); and the distance between the target (Zr) and the $SiO_2$ film (T/S), 65 mm. The Zr film thus obtained had special crystal regions on the opposite surface of the Zr film from the silicon substrate, and was made of dense crystals. Table. 1-1 shows the height, the size (the diameter) when viewed from above, and the density of the special crystal regions, as well as the degree of (002) plane orientation of the Zr layer.

Then, the Zr layer was thermally oxidized in a diffusion furnace at 900° C., and thus a $ZrO_2$ film was formed. The $ZrO_2$ film thus formed had protruding portions with the same height, size, and density as those of the special crystal regions of the Zr layer. The protruding portions were formed on the opposite side of the $ZrO_2$ layer from the silicon substrate. In addition, the $ZrO_2$ layer was made of dense crystals.

Subsequently, the lower electrode film was formed by forming layers of a Ti film of a 20 nm thickness, a first Ir film of a 20 nm thickness, a Pt film of a 60 nm thickness, a second Ir film of a 20 nm thickness in this order by a sputtering method. The conditions for the sputtering of each metal film, specifically, the Ar pressure at film formation, the power density of the output, the temperature at film formation were: for the Ti film, 0.4 Pa, 9 $kW/m^2$, room temperature; for the first Ir film on the Ti film, 0.4 Pa, 30 $kW/m^2$, room temperature; for the Pt film, 0.4 Pa, 30 $kW/m^2$, room temperature; and for the second Ir film on the Pt film, 0.4 Pa, 30 $kW/m^2$, room temperature. The lower electrode film thus obtained had convex portions on the opposite side of the lower electrode film from the silicon substrate. Table 3 shows the height and the like of the convex portions of the lower electrode film. As Table 3 shows, the size of the convex portions of the lower electrode film varies from one to another even though the convex portions derived from the identical special crystal regions of the Zr layer. The difference was caused by the different conditions at film formation.

Thereafter, a piezoelectric layer made of PZT with a 1.1 μm thickness and an upper electrode film made of Ir with a 50 nm thickness were formed. In this way, the actuator was fabricated.

EXAMPLES 2 TO 6

In Examples 2 to 4, actuator devices were fabricated in the same way as the Example 1 except for the conditions for forming each of metal films when the lower electrode films were formed. The different conditions are shown in Table 2. In Examples 5 and 6, actuator devices were fabricated in the same way as the Example 1 except for the conditions for forming Zr films. The different conditions are shown in Table 1-1. Each of the Zr layers thus obtained in Examples 2 to 6 had special crystal regions on the opposite surface of the Zr layer from the silicon substrate, and was made of dense crystals. Table 1-1 shows the heights of special crystal regions and the like as well as the degrees of (002) plane orientation of the Zr layers. In addition, each of the $ZrO_2$ layers in Examples 2 to 6 was made of dense crystals and had protruding portions having the same height, size, and density as each of the special crystal regions of the Zr layer in Examples 2 to 6 on the opposite surface of the $ZrO_2$ layer from the silicon substrate. Each of the lower electrode films in Examples 2 to 6 had convex portions on the opposite surface of the lower electrode film from the silicon substrate. Table 1-1 shows the heights and the like of the convex portions of the lower electrode films.

COMPARATIVE EXAMPLES 1 TO 3

Actuator devices were fabricated in the same way as the Example 1 except for the conditions for forming Zr films. The different conditions are shown in Table 1-2. Each of the Zr films thus obtained had a flat surface, and had no special crystal regions. Each of the $ZrO_2$ layers also had a flat surface, and so did each of the lower electrode films

TABLE 1-1

| | | Zr film | | | | |
| | | | Special crystal regions | | | |
| | Conditions for sputtering | Degree of (002) orientation (%) | Height (nm) | Diameter (μm) | Density (/cm$^2$) | $ZrO_2$ adhesion (mN) |
| --- | --- | --- | --- | --- | --- | --- |
| Example 1 | 0.5 Pa, 15 kW/m$^2$, RT, T/S 65 mm | 82 | 40.6 | 0.5 | $1.11 \times 10^7$ | 360 |
| Example 2 | 0.5 Pa, 15 kW/m$^2$, RT, T/S 65 mm | 82 | 40.6 | 0.5 | $1.11 \times 10^7$ | 360 |
| Example 3 | 0.5 Pa, 15 kW/m$^2$, RT, T/S 65 mm | 82 | 40.6 | 0.5 | $1.11 \times 10^7$ | 360 |

TABLE 1-1-continued

| | | Zr film | | | | |
| | | | Special crystal regions | | | |
| | Conditions for sputtering | Degree of (002) orientation (%) | Height (nm) | Diameter (μm) | Density (/cm$^2$) | ZrO$_2$ adhesion (mN) |
|---|---|---|---|---|---|---|
| Example 4 | 0.5 Pa, 15 kW/m$^2$, RT, T/S 65 mm | 82 | 40.6 | 0.5 | 1.11 × 10$^7$ | 360 |
| Example 5 | 0.5 Pa, 15 kW/m$^2$, RT, T/S 170 mm | 98 | 16.0 | 0.3 | 1.25 × 10$^7$ | 360 |
| Example 6 | 0.3 Pa, 15 kW/m$^2$, RT, T/S 170 mm | 98 | 19.5 | 0.3 | 1.25 × 10$^7$ | 360 |

TABLE 1-2

| | | Zr film | | | | |
| | | | Special crystal regions | | | |
| | Conditions for sputtering | Degree of (002) orientation (%) | Height (nm) | Diameter (μm) | Density (/cm$^2$) | ZrO$_2$ adhesion (mN) |
|---|---|---|---|---|---|---|
| Comparative Example 1 | 4 Pa, 30 kW/m$^2$, RT, T/S 65 mm | 59 | | Not existent | | 106 |
| Comparative Example 2 | 4 Pa, 30 kW/m$^2$, 150° C., T/S 65 mm | 87 | | Not existent | | 150 |
| Comparative Example 3 | 4 Pa, 3 kW/m$^2$, RT, T/S 65 mm | 29 | | Not existent | | 120 |

TABLE 2

| | Lower electrode film | | | |
| | Ti (20 nm) | Ir (20 nm) | Pt (60 nm) | Ir (20 nm) |
|---|---|---|---|---|
| Example 1 | 0.4 Pa, 9 kW/m$^2$, RT | 0.4 Pa, 30 kW/m$^2$, RT | 0.4 Pa, 30 kW/m$^2$, RT | 0.4 Pa, 30 kW/m$^2$, RT |
| Example 2 | 0.4 Pa, 9 kW/m$^2$, RT | 0.8 Pa, 15 kW/m$^2$, RT | 0.8 Pa, 15 kW/m$^2$, RT | 0.8 Pa, 15 kW/m$^2$, RT |
| Example 3 | 0.4 Pa, 9 kW/m$^2$, RT | 0.8 Pa, 15 kW/m$^2$, 100° C. | 0.8 Pa, 15 kW/m$^2$, 100° C. | 0.8 Pa, 15 kW/m$^2$, 100° C. |
| Example 4 | 0.4 Pa, 9 kW/m$^2$, RT | 0.8 Pa, 15 kW/m$^2$, 100° C. | 0.8 Pa, 15 kW/m$^2$, 100° C. | 0.4 Pa, 30 kW/m$^2$, 100° C. |
| Example 5 | 0.4 Pa, 9 kW/m$^2$, RT | 0.4 Pa, 30 kW/m$^2$, RT | 0.4 Pa, 30 kW/m$^2$, RT | 0.4 Pa, 30 kW/m$^2$, RT |
| Example 6 | 0.4 Pa, 9 kW/m$^2$, RT | 0.4 Pa, 30 kW/m$^2$, RT | 0.4 Pa, 30 kW/m$^2$, RT | 0.4 Pa, 30 kW/m$^2$, RT |

TABLE 3

| | Convex portions of lower electrode film | | |
| | Height (nm) | Diameter (μm) | Density (/cm$^2$) |
|---|---|---|---|
| Example 1 | 25.72 | 0.5 | 1.11 × 10$^7$ |
| Example 2 | 29.75 | 0.5 | 1.11 × 10$^7$ |
| Example 3 | 32.88 | 0.5 | 1.11 × 10$^7$ |
| Example 4 | 33.04 | 0.5 | 1.11 × 10$^7$ |
| Example 5 | 19.67 | 0.3 | 1.25 × 10$^7$ |
| Example 6 | 21.30 | 0.3 | 1.25 × 10$^7$ |

Test Example: Measurement of Adhesion

For the purpose of evaluating the adhesion between SiO$_2$ layer and the ZrO$_2$ layer, scratching test was carried out using a scratching-test apparatus for the actuator devices of Examples 1 to 6 and Comparative Examples 1 to 3. Table 1-1 and Table 1-2 show the results.

The results shows that the adhesion between SiO$_2$ layer and the ZrO$_2$ layer is favorable in each of Examples 1 to 6 in each of which the ZrO$_2$ layer is formed by oxidizing the Zr layer having special crystal regions. In each of Comparative Examples 1 to 3, the ZrO$_2$ layer is formed by oxidizing the Zr layer without special crystal regions, and the adhesion in each of Comparative Examples 1 to 3 was significantly poorer than that of Examples 1 to 6. In addition, the lower electrode film is not delaminated from the ZrO$_2$ layer of each of the Examples 1 to 6. This indicates that the adhesion between the ZrO$_2$ layer and the lower electrode film was favorable in each of Examples 1 to 6.

Other Embodiments

Although, an embodiment of the invention has been described thus far, the basic configuration of the invention is not limited to the Embodiment 1 described above. For example, in Embodiment 1, the SiO$_2$ layer and the Zr layer are formed in this order on the substrate, but the Zr layer may be formed directly on a metal-oxide substrate. An example of metals for such a metal oxide is Mg. An actuator device with such a configuration has an excellent adhesion between the lower electrode film and the ZrO$_2$ layer as well as between the substrate and the ZrO$_2$ layer. Note that the substrate has only to have a metal-oxide surface on a side where the Zr layer is to be formed. For example, an allowable substrate has a metal-oxide film formed on a side of the substrate body on which side the Zr layer is to be formed.

In addition, the description in Embodiment 1 is done by taking the ink-jet recording head as an example of the liquid-jet head. The invention, however, is targeted widely to liquid-jet heads in general, and can also be applied to a liquid-jet head that injects a liquid other than ink. Examples of such liquid-jet heads include: various kinds of recording heads used in image recording apparatuses such as printers; color-material-jet heads used in manufacturing color filters of liquid crystal display devices and the like; electrode-material-jet heads used in forming electrodes of organic EL display devices, field emission display (FED) devices, and the like; and bio-organic-material-jet heads used in manufacturing bio-chips. In addition, the invention may be applied, not only to actuator devices that are mounted on the liquid-jet heads (ink-jet recording head or the like), but also to actuator devices that are mounted on any kinds of apparatuses.

What is claimed is:

1. A method of manufacturing an actuator device comprising:
    forming a Zr layer on one surface of a substrate;
    forming a $ZrO_2$ layer by oxidizing the Zr layer;
    forming a lower electrode on top of the $ZrO_2$ layer;
    forming a piezoelectric layer on top of the lower electrode; and
    forming an upper electrode on top of the piezoelectric layer,
    wherein, in forming the Zr layer, the Zr layer is formed through crystal growth of Zr, and
    the Zr layer thus formed has special crystal regions that protrude from an opposite surface of the Zr layer from the substrate, each special crystal region having a height of 10 to 100 nm and a diameter of 0.1 to 1 μm when viewed from above, and the special crystal regions existing with a density of $1.0 \times 10^6$ to $1.0 \times 10^8 / cm^2$.

2. The method of manufacturing an actuator device according to claim 1,
    the Zr layer thus formed has special crystal regions that protrude from the opposite surface of the Zr layer from the substrate, each special crystal region having a height of 16.0 to 40.6 nm and a diameter of 0.3 to 0.5 μm when viewed from above, and the special crystal regions existing with a density of $1.11 \times 10^7$ to $1.25 \times 10^7 / cm^2$.

3. The method of manufacturing an actuator device according to claim 1, wherein in forming the Zr layer, a $SiO_2$ layer is formed on top of the substrate, and then the Zr layer is formed on top of the $SiO_2$ layer.

4. The method of manufacturing an actuator device according to claim 1,
    wherein the substrate has the one surface made of a metal oxide, and
    in forming the Zr layer, the Zr layer is formed directly on top of the substrate.

5. The method of manufacturing an actuator device according to claim 1, wherein in forming the Zr layer, the Zr layer is formed by a sputtering method.

* * * * *